United States Patent
Jin

(10) Patent No.: US 9,966,572 B2
(45) Date of Patent: May 8, 2018

(54) FLEXIBLE ORGANIC LIGHT EMITTING DIODE DISPLAY AND METHOD OF FABRICATING THE SAME

(71) Applicant: Wuhan China Star Optoelectronics Technology Co., Ltd., Wuhan (CN)

(72) Inventor: Jiangjiang Jin, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days. days.

(21) Appl. No.: 15/310,099

(22) PCT Filed: Aug. 19, 2016

(86) PCT No.: PCT/CN2016/096059
§ 371 (c)(1),
(2) Date: Nov. 10, 2016

(87) PCT Pub. No.: WO2018/018683
PCT Pub. Date: Feb. 1, 2018

(65) Prior Publication Data
US 2018/0053916 A1  Feb. 22, 2018

(30) Foreign Application Priority Data
Aug. 26, 2016 (CN) .......................... 2016 1 0596725

(51) Int. Cl.
*H01L 51/56* (2006.01)
*H01L 51/52* (2006.01)
*H01L 51/00* (2006.01)

(52) U.S. Cl.
CPC ...... *H01L 51/5268* (2013.01); *H01L 51/0097* (2013.01); *H01L 51/5253* (2013.01); *H01L 51/56* (2013.01); *H01L 51/525* (2013.01); *H01L 51/5262* (2013.01); *H01L 2251/301* (2013.01); *H01L 2251/303* (2013.01); *H01L 2251/5338* (2013.01); *H01L 2251/558* (2013.01)

(58) Field of Classification Search
CPC ............. H01L 51/5268; H01L 51/0097; H01L 51/5253; H01L 51/56; H01L 51/50; H01L 51/525; H01L 51/5262; H01L 2251/5338; H01L 2251/558; H01L 2251/301; H01L 2251/303
See application file for complete search history.

(56) References Cited

U.S. PATENT DOCUMENTS

2010/0283056 A1* 11/2010 Yasumatsu ........ G02F 1/133305
257/59
2014/0356527 A1* 12/2014 Yoon ..................... C23C 16/405
427/162

(Continued)

Primary Examiner — Thanh T Nguyen

(57) ABSTRACT

A flexible organic light emitting diode display and a method of fabricating the same are provided. The method has steps of: performing a patterning process on a photoresist layer to form a plurality of photoresist portions; etching a fluoropolymer layer to form a plurality of polymerization portions; depositing a material of a light extracting enhanced layer on the photoresist portions to form a plurality of light extracting enhanced portions; removing the fluoropolymer layer and the photoresist layer; fabricating a buffer layer on the light extracting enhanced portions; and fabricating a second waterproof layer on the buffer layer.

20 Claims, 2 Drawing Sheets

(56) References Cited

U.S. PATENT DOCUMENTS

2015/0014636 A1* 1/2015 Kang .................. H01L 51/5253
                                                              257/40
2016/0276624 A1* 9/2016 Wang ...................... H01L 51/56

* cited by examiner

FLEXIBLE ORGANIC LIGHT EMITTING DIODE DISPLAY AND METHOD OF FABRICATING THE SAME

RELATED APPLICATIONS

This application is a National Phase of PCT Patent Application No. PCT/CN2016/096059 having International filing date of Aug. 19, 2016, which claims the benefit of priority of Chinese Patent Application No. 201610596725.0 filed on Jul. 26, 2016. The contents of the above applications are all incorporated by reference as if fully set forth herein in their entirety.

FIELD AND BACKGROUND OF THE INVENTION

The present invention relates to a display technical field, and more particularly to a flexible organic light emitting diode display and a method of fabricating the same.

An organic light emitting diode (OLED), based on advantages of high contrast, wide color gamut, self-luminous, fast responding speed and so on, is widely applied in a display and lighting field. Particularly, a huge market potential, which other display technologies do not possess, is shown in a flexible display field.

However, currently, a factor restricting a development of a flexible display is an encapsulating capability of a device. A present flexible OLED device is very easy to induce a breaking or peeling of an encapsulating film upon bending or folding. Further, due to a difference of a refractive index between a material of an organic light emitting layer and a material of an electrode, or a difference of a refractive index between a material of a substrate and air, a large number of photons are caused to be restricted in the substrate or may dissipate between the organic material and a cathode interface by an ion mode of simulating a cathode surface. Therefore, an actual light extraction efficiency of the OLED device is relative low.

As a result, it is necessary to provide a flexible organic light emitting diode display and a method of fabricating the same to solve the problems existing in the conventional technologies.

SUMMARY OF THE INVENTION

An object of the present invention is to provide a flexible organic light emitting diode display, so as to solve a technical problem of a conventional technical organic light emitting diode with a relatively low light extraction efficiency.

To solve the above problems, the present invention is constructive of a method of fabricating a flexible organic light emitting diode display, comprising steps of:
  forming an organic light emitting diode on a substrate;
  forming a first waterproof layer on the organic light emitting diode;
  forming a fluoropolymer layer on the organic light emitting diode;
  forming a photoresist layer on the fluoropolymer layer, and performing a
  patterning process on the photoresist layer to form a plurality of photoresist portions, wherein a space between two of the photoresist portions adjacent to each other near the first waterproof layer is greater than that of the two adjacent photoresist portions away from the first waterproof layer,
  etching the fluoropolymer layer to form a plurality of polymerization portions, wherein the polymerization portions are aligned with the photoresist portions;
  depositing a material of a light extracting enhanced layer first waterproof layer to form a plurality of light extracting enhanced portions between the polymerization portions, wherein the light extracting enhanced portions are configured to enhance a light extracting efficiency of the organic light emitting diode;
  removing the polymerization portions and the photoresist portions;
  fabricating a buffer layer on the light extracting enhanced portions, wherein a thickness of the buffer layer is greater than that of the light extracting enhanced portions; and
  fabricating a second waterproof layer on the buffer layer;
  wherein the buffer layer is made of an organic material; and the first waterproof layer, the second waterproof layer, and the light extracting enhanced layer are made of inorganic materials;
  wherein a cross-sectional shape of the photoresist portions is quadrilateral, and each of the photoresist portions has two side surfaces opposite each other, wherein an acute angle, between each of the side surfaces and a plane on which the fluoropolymer layer is located, is smaller than or identical to a predetermined angle.

In the method of fabricating the flexible organic light emitting diode display of the present invention, each of the photoresist portions further comprises a lower end surface and an upper end surface, and a difference value between a width of each of the polymerization portions and a width of the lower surface is within a predetermined range.

In the method of fabricating the flexible organic light emitting diode display of the present invention, a thickness of the fluoropolymer layer is smaller than or identical to that of the photoresist layer.

In the method of fabricating the flexible organic light emitting diode display of the present invention, a thickness of the light extracting enhanced portions is smaller than that of the polymerization portions.

In the method of fabricating the flexible organic light emitting diode display of the present invention, a cross-sectional shape of each of the polymerization portions is rectangular.

In the method of fabricating the flexible organic light emitting diode display of the present invention, each of the light extracting enhanced portions has a curved top.

In the method of fabricating the flexible organic light emitting diode display of the present invention, the light extracting enhanced layer is made of at least one of $Al_2O_3$, $TiO_2$, $SiN_x$, $SiCN_x$ and $SiO_x$.

In the method of fabricating the flexible organic light emitting diode display of the present invention, the buffer layer is made of one or more of acrylamide, hexamethyl disiloxane, polyacrylate, polycarbonate, and polystyrene.

To solve the above problems, the present invention is constructive of a method of fabricating a flexible organic light emitting diode display, comprising steps of:
  forming an organic light emitting diode on a substrate;
  forming a first waterproof layer on the organic light emitting diode;
  forming a fluoropolymer layer on the organic light emitting diode;
  forming a photoresist layer on the fluoropolymer layer, and performing a
  patterning process on the photoresist layer to form a plurality of photoresist portions, wherein a space between two of the photoresist portions adjacent to each other near the first waterproof layer is greater than that of the two adjacent photoresist portions away from the first waterproof layer;

etching the fluoropolymer layer to form a plurality of polymerization portions, wherein the polymerization portions are aligned with the photoresist portions;

depositing a material of a light extracting enhanced layer on the first waterproof layer to form a plurality of light extracting enhanced portions between the polymerization portions, wherein the light extracting enhanced portions are configured to enhance a light extracting efficiency of the organic light emitting diode;

removing the polymerization portions and the photoresist portions;

fabricating a buffer layer on the light extracting enhanced portion; and fabricating a second waterproof layer on the buffer layer;

wherein the buffer layer is made of an organic material; and the first waterproof layer, the second waterproof layer and the light extracting enhanced layer are made of inorganic materials.

In the method of fabricating the flexible organic light emitting diode display of the present invention, a cross-sectional shape of the photoresist portions is quadrilateral, and each of the photoresist portions has two side surfaces opposite each other, wherein an acute angle, between each of the side surfaces and a plane on which the fluoropolymer layer is located, is smaller than or identical to a predetermined angle.

In the method of fabricating the flexible organic light emitting diode display of the present invention, each of the photoresist portions further comprises a lower end surface and an upper end surface, and a difference value between a width of each of the polymerization portions and a width of the lower surface is within a predetermined range.

In the method of fabricating the flexible organic light emitting diode display of the present invention, a thickness of the fluoropolymer layer is smaller than or identical to that of the photoresist layer.

In the method of fabricating the flexible organic light emitting diode display of the present invention, a thickness of the light extracting enhanced portions is smaller than that of the polymerization portions.

In the method of fabricating the flexible organic light emitting diode display of the present invention, a cross-sectional shape of each of the polymerization portions is rectangular.

In the method of fabricating the flexible organic light emitting diode display of the present invention, each of the light extracting enhanced portions has a curved top.

In the method of fabricating the flexible organic light emitting diode display of the present invention, a thickness of the buffer layer is greater than that of the light extracting enhanced portions.

In the method of fabricating the flexible organic light emitting diode display of the present invention, the light extracting enhanced layer is made of at least one of $Al_2O_3$, $TiO_2$, $SiN_x$, $SiCN_x$ and $SiO_x$.

The present invention further provides a flexible organic light emitting diode display, comprising:

an organic light emitting diode located on a substrate;

an encapsulation layer located on the organic light emitting diode and comprising:

a first waterproof layer;

a light extracting enhanced layer comprising a plurality of light extracting enhanced portions disposed with intervals, wherein the light extracting enhanced portions are configured to enhance a light extracting efficiency of the organic light emitting diode;

a buffer layer located on the extracting enhanced portions; and a second waterproof layer located on the buffer layer, wherein the first waterproof layer, the second waterproof layer and the light extracting enhanced layer are made of inorganic materials;

and the buffer layer is made of an organic material.

In the flexible organic light emitting diode display of the present invention, the light extracting enhanced layer is made of at least one of $Al_2O_3$, $TiO_2$, $SiN_x$, $SiCN_x$ and $SiO_x$.

In the flexible organic light emitting diode display of the present invention, the buffer layer is made of one or more of acrylamide, hexamethyl disiloxane, polyacrylate, polycarbonate, and polystyrene.

In the flexible organic light emitting diode display and the method of fabricating the same of the present invention can prevent from the encapsulation layer being damaged through fabricating the thin-film encapsulation layer with the alternative inorganic materials and organic materials. Simultaneously, a light extracting enhanced structure is disposed in the encapsulation layer to further enable enhancing a scattering effect of light and improving the light extracting efficiency effectively.

DESCRIPTION OF SPECIFIC EMBODIMENTS OF THE INVENTION

The following description of the embodiments with reference to the appended drawings is used for illustrating specific embodiments which may be used for carrying out the present invention. The directional terms described by the present invention, such as "upper", "lower", "front", "back", "left", "right", "inner", "outer", "side", etc., are only directions by referring to the accompanying drawings. Thus, the used directional terms are used to describe and understand the present invention, but the present invention is not limited thereto. In figures, elements with similar structures are indicated by the same numbers.

Figure 1:
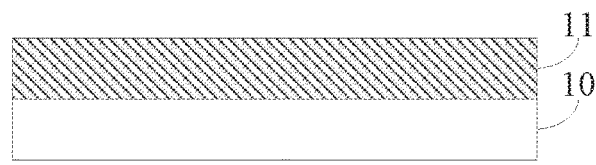
FIG. 1 is a structural schematic diagram of a first step of a method of fabricating a flexible organic light emitting diode display of the present invention.

FIG. 1 is a structural schematic diagram of a first step of a method of fabricating a flexible organic light emitting diode display of the present invention.

A method of fabricating a flexible organic light emitting diode display, comprising steps of:

S101: forming a first waterproof layer on the organic light emitting diode.

As shown in FIG. 1, a first waterproof layer 11 is formed on the organic light emitting diode 10. The first waterproof layer 11 is made of an inorganic material, such as one or more of aluminum oxide $Al_2O_3$, titanium dioxide $TiO_2$, silicon nitride $SiN_x$, $SiCN_x$, nanometer silicon dioxide. The organic light emitting diode comprises an anode layer, an organic light emitting layer, and a cathode layer. Specifically, for example the prepared organic light emitting diode is disposed in a chamber of using plasma enhanced chemical vapor deposition (PECVD) method, atomic layer deposition (ALD), pulsed laser deposition (PLD), or sputter to obtain the first waterproof layer by depositing on the cathode layer or sputtering an inorganic material with a waterproof effect.

S102: forming a fluoropolymer layer on the organic light emitting diode.

Figure 2:
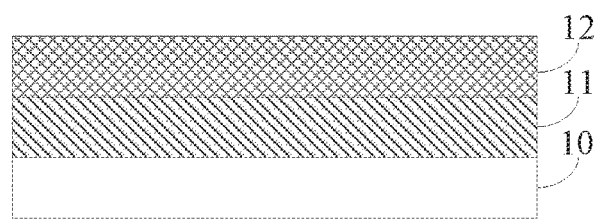
FIG. 2 is a structural schematic diagram of a second step of a method of fabricating a flexible organic light emitting diode display of the present invention.

As shown in FIG. 2, for example, the organic light emitting diode with the waterproof layer is moved into a glove box. A fluoropolymer material is formed on the first waterproof layer 11 by a coating method and is cured at 80 degrees for 1 hour, so as to obtain a fluoropolymer layer 12. For example, a thickness of the fluoropolymer layer 12 is from 1 to 2 micrometers.

S103: forming a photoresist layer on the fluoropolymer layer, and performing a patterning process on the photoresist layer to form a plurality of photoresist portions.

Figure 3:
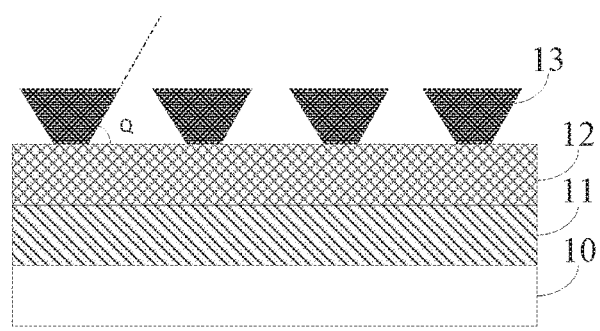
FIG. 3 is a structural schematic diagram of a third step of a method of fabricating a flexible organic light emitting diode display of the present invention.

As shown in FIG. 3, for example, a photoresist material is coated on the fluoropolymer layer 12 to form a whole-layered photoresist layer. Then, the whole-layered photoresist layer is exposed, developed to form a plurality of photoresist portions 13. A space between two of the photoresist portions adjacent to each other near the first waterproof layer is greater than that of the two adjacent photoresist portions away from the first waterproof layer, i.e., a space between the below photoresist portions is greater than that between the above photoresist portions, so as to confine forming light extracting enhanced portions with a scattering effect.

Preferably, a cross-sectional shape of the photoresist portions 13 is quadrilateral, such as isosceles trapezoid and etc. Each of the photoresist portions 13 has two side surfaces, which are a left side surface and a right side surface, opposite each other. For example, an angle, between the right side surface and a plane on which the fluoropolymer layer 12 is located, is less than or identical to 45 degrees; and an acute angle, between the left side surface and a plane on which the fluoropolymer layer is located, is less than or identical to 45 degrees. Each of the light extracting enhanced portions with a curved top is more advantage of forming and causing a relatively good scattering effect.

S104: etching the fluoropolymer layer to form a plurality of polymerization portions, wherein the polymerization portions are aligned with the photoresist portions.

Figure 4:
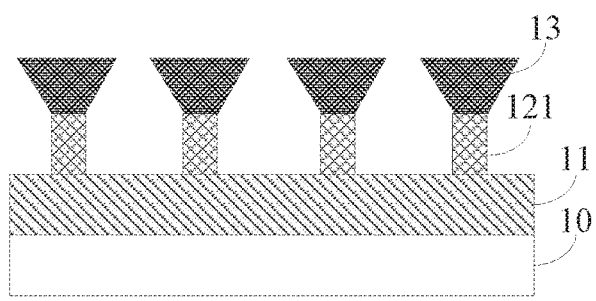
FIG. 4 is a structural schematic diagram of a fourth step of a method of fabricating a flexible organic light emitting diode display of the present invention.

As shown in FIG. 4, the fluoropolymer layer 12 is etched by an oxygen plasma dry etching method to obtain a plurality of polymerization portions 121. The polymerization portions 121 are aligned with the photoresist portions 13.

Preferably, each of the photoresist portions 13 further comprises a lower end surface and an upper end surface (such as a lower surface and an upper surface). A difference value between a width of each of the polymerization portions 121 (a width in a horizontal direction) and a width of the lower surface is within a predetermined range. For example, the difference value between both is close to zero, thereby enabling a surface of the light emitting layer being smoother and having a better light scattering property when a material of the light extracting enhanced layer is deposited.

Preferably, a thickness of the fluoropolymer layer 12 is smaller than or identical to that of the photoresist layer, thereby enabling preventing the fluoropolymer layer 12 from connecting to the material of the light extracting enhanced layer above the photoresist portions when the material of the light extracting enhanced layer is deposited.

S105: depositing a material of a light extracting enhanced layer on the first waterproof layer to form a plurality of light extracting enhanced portions between the polymerization portions, wherein the light extracting enhanced portions are configured to enhance a light extracting efficiency of the organic light emitting diode.

Figure 5:
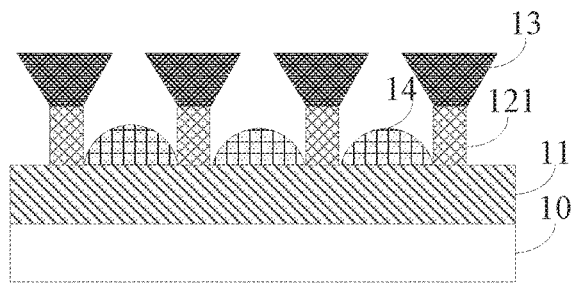
FIG. 5 is a structural schematic diagram of a fifth step of a method of fabricating a flexible organic light emitting diode display of the present invention.

Specifically, as shown in FIG. 5, the organic light emitting diode prepared by step S104 is disposed in a chamber of using plasma enhanced chemical vapor deposition (PECVD) method, atomic layer deposition (ALD), pulsed laser deposition (PLD), or sputter, an inorganic material is deposited or sputtered on the photoresist portions 13. The inorganic material which is not being deposited by the photoresist portions forms a plurality of light extracting enhanced portions 14. The inorganic material covered by the photoresist portions is deposited on the photoresist portions 13 (not shown). The light extracting enhanced portions 14 are made of at least one or more of aluminum oxide $Al_2O_3$, titanium dioxide $TiO_2$, silicon nitride $SiN_x$, $SiCN_x$, nanometer silicon dioxide. For example, a thickness of each of the light extracting enhanced portions 14 is from 1 to 2 micrometers.

Preferably, a thickness of the light extracting enhanced portions 14 is smaller than that of the polymerization portions 121, which can be beneficial to form the light extracting enhanced portions 14 with a curved top for enhancing the light scattering property.

Preferably, each of the light extracting enhanced portions 14 has a curved top. For example, a cross-sectional shape of the light extracting enhanced portions is semicircular and certainly can be other shapes of curved structures. Due to the top with a curved structure being more beneficial to light scattering, the emitting rate of light is raised.

S106: removing the polymerization portions and the photoresist portions.

Figure 6:
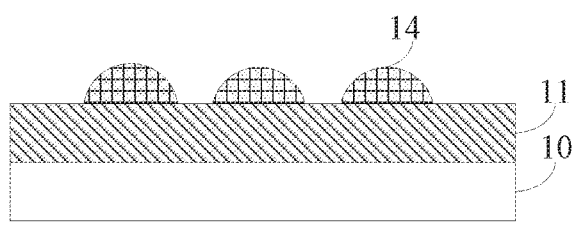
FIG. 6 is a structural schematic diagram of a sixth step of a method of fabricating a flexible organic light emitting diode display of the present invention.

For example, the inorganic material located on the photoresist portions 13 is removed. Then, the organic light emitting diode device with the light extracting enhanced portions 14 are placed in a hydrofluoroether solution for 2 hours. The polymerization portions 121 and the photoresist portions 13 in FIG. 4 are stripped. Then, a drying is performed at 60 degrees for 5 hours. A final structure is shown in FIG. 6.

S107: fabricating a buffer layer on the light extracting enhanced portion.

Figure 7:
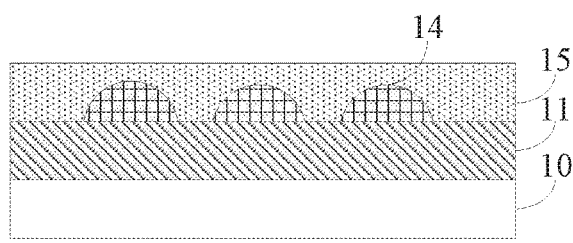
FIG. 7 is a structural schematic diagram of a seventh step of a method of fabricating a flexible organic light emitting diode display of the present invention.

As shown in FIG. 7, the buffer layer 15 is formed on the photoresist portions 14 by, for example, ink-jet printing or a plasma enhanced chemical vapor deposition method. The buffer layer 15 is made of one or more of acrylamide (Acryl), hexamethyl disiloxane (HMDSO), polyacrylate, polycarbonate and polystyrene. The buffer layer 15 is used for releasing a stress upon bending or folding. For example, a thickness of the buffer layer 15 is from 8 to 10 micrometers.

S108: fabricating a second waterproof layer on the buffer layer.

Figure 8:
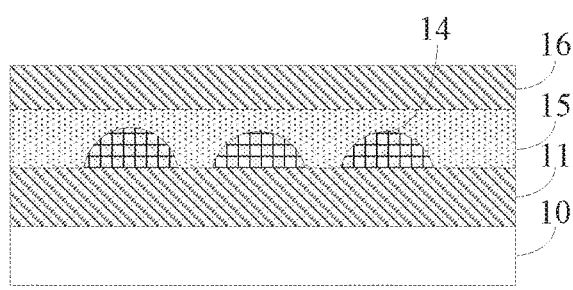
FIG. 8 is a structural schematic diagram of an eighth step of a method of fabricating a flexible organic light emitting diode display of the present invention.

As shown in FIG. 8, the organic light emitting diode prepared by step S107 is placed in a chamber of using plasma enhanced chemical vapor deposition (PECVD) method, atomic layer deposition (ALD), pulsed laser deposition (PLD), or sputter to form the second waterproof layer 16 on the buffer layer 15 by depositing. It should be appreciated that the second waterproof layer 16 is made of one or more of aluminum oxide $Al_2O_3$, titanium dioxide $TiO_2$, silicon nitride $SiN_x$, $SiCN_x$, nanometer silicon dioxide. For example, a thickness of the second waterproof layer 16 is from 1 to 2 micrometers.

The present invention further provides a flexible organic light emitting diode display, as shown in FIG. 8, comprising: an organic light emitting diode 10, an encapsulation layer. The organic light emitting diode 10 is located on a substrate and comprises an anode layer, an organic light emitting layer, and a cathode layer. The encapsulation layer is located on the organic light emitting diode 10. The encapsulation layer comprises: a first waterproof layer 11, a light extracting enhanced layer, a buffer layer 15, and a second waterproof layer 16. The first waterproof layer 11 is located on the organic light emitting diode 10. The light extracting enhanced layer comprises a plurality of light extracting enhanced portions 14 disposed with intervals. The light extracting enhanced portions 14 are configured to enhance a light extracting efficiency of the organic light emitting diode. The buffer layer 15 is located on the extracting enhanced portions 14. The second waterproof layer 16 is located on the buffer layer 15, wherein the first waterproof layer 11, the second waterproof layer 16 and the light extracting enhanced layer are made of inorganic materials; and the buffer layer 15 is made of an organic material.

The flexible organic light emitting diode display and the method of fabricating the same of the present invention can release the stress better during bending and can prevent from the encapsulation layer being damaged through fabricating the thin-film encapsulation layer with the alternative inorganic materials and organic materials. Simultaneously, a light extracting enhanced structure is disposed in the encapsulation layer to enable enhancing a scattering effect of light so as to improve the light extracting efficiency effectively.

As described above, although the present invention has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. A method of fabricating a flexible organic light emitting diode display, comprising steps of:
    forming an organic light emitting diode on a substrate;
    forming a first waterproof layer on the organic light emitting diode;
    forming a fluoropolymer layer on the organic light emitting diode;
    forming a photoresist layer on the fluoropolymer layer, and performing a patterning process on the photoresist layer to form a plurality of photoresist portions, wherein a space between two of the photoresist portions adjacent to each other near the first waterproof layer is greater than that of the two adjacent photoresist portions away from the first waterproof layer;
    etching the fluoropolymer layer to form a plurality of polymerization portions, wherein the polymerization portions are aligned with the photoresist portions;
    depositing a material of a light extracting enhanced layer on the first waterproof layer to form a plurality of light extracting enhanced portions between the polymerization portions, wherein the light extracting enhanced portions are configured to enhance a light extracting efficiency of the organic light emitting diode;
    removing the polymerization portions and the photoresist portions;
    fabricating a buffer layer on the light extracting enhanced portions, wherein a thickness of the buffer layer is greater than that of the light extracting enhanced portions; and
    fabricating a second waterproof layer on the buffer layer;
    wherein the buffer layer is made of an organic material; and the first waterproof layer, the second waterproof layer and the light extracting enhanced layer are made of inorganic materials;
    wherein a cross-sectional shape of the photoresist portions is quadrilateral, and each of the photoresist portions has two side surfaces opposite each other, wherein an acute angle, between each of the side surfaces and a plane on which the fluoropolymer layer is located, is smaller than or identical to a predetermined angle.

2. The method of fabricating the flexible organic light emitting diode display according to claim 1, wherein each of the photoresist portions further comprises a lower end surface and an upper end surface, and a difference value between a width of each of the polymerization portions and a width of the lower surface is within a predetermined range.

3. The method of fabricating the flexible organic light emitting diode display according to claim 1, wherein a thickness of the fluoropolymer layer is smaller than or identical to that of the photoresist layer.

4. The method of fabricating the flexible organic light emitting diode display according to claim 1, wherein a thickness of the light extracting enhanced portions is smaller than that of the polymerization portions.

5. The method of fabricating the flexible organic light emitting diode display according to claim 1, wherein a cross-sectional shape of each of the polymerization portions is rectangular.

6. The method of fabricating the flexible organic light emitting diode display according to claim 1, wherein each of the light extracting enhanced portions has a curved top.

7. The method of fabricating the flexible organic light emitting diode display according to claim 1, wherein the light extracting enhanced layer is made of at least one of $Al_2O_3$, $TiO_2$, $SiN_x$, $SiCN_x$ and $SiO_x$.

8. The method of fabricating the flexible organic light emitting diode display according to claim 1, wherein the buffer layer is made of one or more of acrylamide, hexamethyl disiloxane, polyacrylate, polycarbonate, and polystyrene.

9. A method of fabricating a flexible organic light emitting diode display, comprising steps of:
    forming an organic light emitting diode on a substrate;
    forming a first waterproof layer on the organic light emitting diode;
    forming a fluoropolymer layer on the organic light emitting diode;
    forming a photoresist layer on the fluoropolymer layer, and performing a patterning process on the photoresist layer to form a plurality of photoresist portions, wherein a space between two of the photoresist portions adjacent to each other near the first waterproof layer is greater than that of the two adjacent photoresist portions away from the first waterproof layer;

etching the fluoropolymer layer to form a plurality of polymerization portions, wherein the polymerization portions are aligned with the photoresist portions;

depositing a material of a light extracting enhanced layer on the first waterproof layer to form a plurality of light extracting enhanced portions between the polymerization portions, wherein the light extracting enhanced portions are configured to enhance a light extracting efficiency of the organic light emitting diode;

removing the polymerization portions and the photoresist portions;

fabricating a buffer layer on the light extracting enhanced portion; and fabricating a second waterproof layer on the buffer layer;

wherein the buffer layer is made of an organic material; and the first waterproof layer, the second waterproof layer and the light extracting enhanced layer are made of inorganic materials.

10. The method of fabricating the flexible organic light emitting diode display according to claim 9, wherein a cross-sectional shape of the photoresist portions is quadrilateral, and each of the photoresist portions has two side surfaces opposite each other, wherein an acute angle, between each of the side surfaces and a plane on which the fluoropolymer layer is located, is smaller than or identical to a predetermined angle.

11. The method of fabricating the flexible organic light emitting diode display according to claim 10, wherein each of the photoresist portions further comprises a lower end surface and an upper end surface, and a difference value between a width of each of the polymerization portions and a width of the lower surface is within a predetermined range.

12. The method of fabricating the flexible organic light emitting diode display according to claim 9, wherein a thickness of the fluoropolymer layer is smaller than or identical to that of the photoresist layer.

13. The method of fabricating the flexible organic light emitting diode display according to claim 9, wherein a thickness of the light extracting enhanced portions is smaller than that of the polymerization portions.

14. The method of fabricating the flexible organic light emitting diode display according to claim 9, wherein a cross-sectional shape of each of the polymerization portions is rectangular.

15. The method of fabricating the flexible organic light emitting diode display according to claim 9, wherein each of the light extracting enhanced portions has a curved top.

16. The method of fabricating the flexible organic light emitting diode display according to claim 9, wherein a thickness of the buffer layer is greater than that of the light extracting enhanced portions.

17. The method of fabricating the flexible organic light emitting diode display according to claim 9, wherein the light extracting enhanced layer is made of at least one of $Al_2O_3$, $TiO_2$, $SiN_x$, $SiCN_x$ and $SiO_x$.

18. A flexible organic light emitting diode display, comprising:
    an organic light emitting diode located on a substrate;
    an encapsulation layer located on the organic light emitting diode and comprising:
    a first waterproof layer;
    a light extracting enhanced layer comprising a plurality of light extracting enhanced portions disposed with intervals, wherein the light extracting enhanced portions are configured to enhance a light extracting efficiency of the organic light emitting diode;
    a buffer layer located on the extracting enhanced portions; and
    a second waterproof layer located on the buffer layer, wherein the first waterproof layer, the second waterproof layer and the light extracting enhanced layer are made of inorganic materials; and the buffer layer is made of an organic material.

19. The flexible organic light emitting diode display according to claim 18, wherein the light extracting enhanced layer is made of at least one of $Al_2O_3$, $TiO_2$, $SiN_x$, $SiCN_x$ and $SiO_x$.

20. The flexible organic light emitting diode display according to claim 18, wherein the buffer layer is made of one or more of acrylamide, hexamethyl disiloxane, polyacrylate, polycarbonate, and polystyrene.

* * * * *

UNITED STATES PATENT AND TRADEMARK OFFICE
CERTIFICATE OF CORRECTION

| | |
|---|---|
| PATENT NO. | : 9,966,572 B2 |
| APPLICATION NO. | : 15/310099 |
| DATED | : May 8, 2018 |
| INVENTOR(S) | : Jiangjiang Jin |

It is certified that error appears in the above-identified patent and that said Letters Patent is hereby corrected as shown below:

On the Title Page

Item (30) Foreign Application Priority Data:
"Aug. 26, 2016" should be changed to --Jul. 26, 2016--

Signed and Sealed this
Twenty-first Day of August, 2018

Andrei Iancu
*Director of the United States Patent and Trademark Office*